(12) United States Patent
Yamauchi

(10) Patent No.: US 12,267,052 B2
(45) Date of Patent: Apr. 1, 2025

(54) POWER AMPLIFYING DEVICE

(71) Applicants: Kabushiki Kaisha Toshiba, Tokyo (JP); Toshiba Electronic Devices & Storage Corporation, Tokyo (JP)

(72) Inventor: Akira Yamauchi, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 609 days.

(21) Appl. No.: 17/653,543

(22) Filed: Mar. 4, 2022

(65) Prior Publication Data

US 2023/0091797 A1 Mar. 23, 2023

(30) Foreign Application Priority Data

Sep. 22, 2021 (JP) .................. 2021-154124

(51) Int. Cl.
*H03F 1/07* (2006.01)
*H03F 3/24* (2006.01)
*H03F 3/68* (2006.01)

(52) U.S. Cl.
CPC .............. *H03F 3/245* (2013.01); *H03F 3/68* (2013.01)

(58) Field of Classification Search
CPC .................... H03F 1/02; H03F 1/07
USPC ............................. 330/124 R, 295
See application file for complete search history.

(56) References Cited

U.S. PATENT DOCUMENTS

| | | | |
|---|---|---|---|
| 5,365,188 A | 11/1994 | Botti et al. | |
| 5,424,683 A | 6/1995 | Takahashi | |
| 6,107,886 A | 8/2000 | Kusakabe et al. | |
| 7,622,991 B2 * | 11/2009 | Sauer | H03F 3/45968 330/69 |
| 2005/0218987 A1 | 10/2005 | Tsurumi | |
| 2006/0022741 A1 * | 2/2006 | Hopkins | H03F 3/211 327/407 |
| 2007/0241807 A1 * | 10/2007 | Hopkins | H03F 3/72 327/407 |
| 2013/0195289 A1 | 8/2013 | Yamauchi et al. | |

(Continued)

FOREIGN PATENT DOCUMENTS

| | | |
|---|---|---|
| JP | H06-318830 A | 11/1994 |
| JP | H06-338738 A | 12/1994 |
| JP | H09-130183 A | 5/1997 |

(Continued)

OTHER PUBLICATIONS

Office Action of corresponding Japanese Patent Application No. 2021-154124 issued on Jun. 25, 2024, 6 pages.

*Primary Examiner* — Henry Choe
(74) *Attorney, Agent, or Firm* — Knobbe, Martens, Olson & Bear, LLP

(57) ABSTRACT

According to one embodiment, a power amplifying device includes a first amplifier configured to output a first output signal, a second amplifier configured to output a second output signal, a first circuit configured to output a third signal obtained by limiting a magnitude of a voltage value of the first output signal and a fourth signal obtained by limiting a magnitude of a voltage value of the second output signal, and a second circuit configured to transmit an average value of a voltage value of the third signal and a voltage value of the fourth signal, as a first feedback voltage to the first amplifier and the second amplifier.

14 Claims, 9 Drawing Sheets

(56) References Cited

U.S. PATENT DOCUMENTS

2020/0162040 A1   5/2020  Yamauchi et al.

FOREIGN PATENT DOCUMENTS

| JP | H11-284450     | 10/1999 |
| JP | 2005-286815 A  | 10/2005 |
| JP | 2007-068131 A1 | 3/2007  |
| JP | 2013-038538 A  | 2/2013  |
| JP | 2013-157664 A  | 8/2013  |
| JP | 2020-088530 A  | 6/2020  |

* cited by examiner

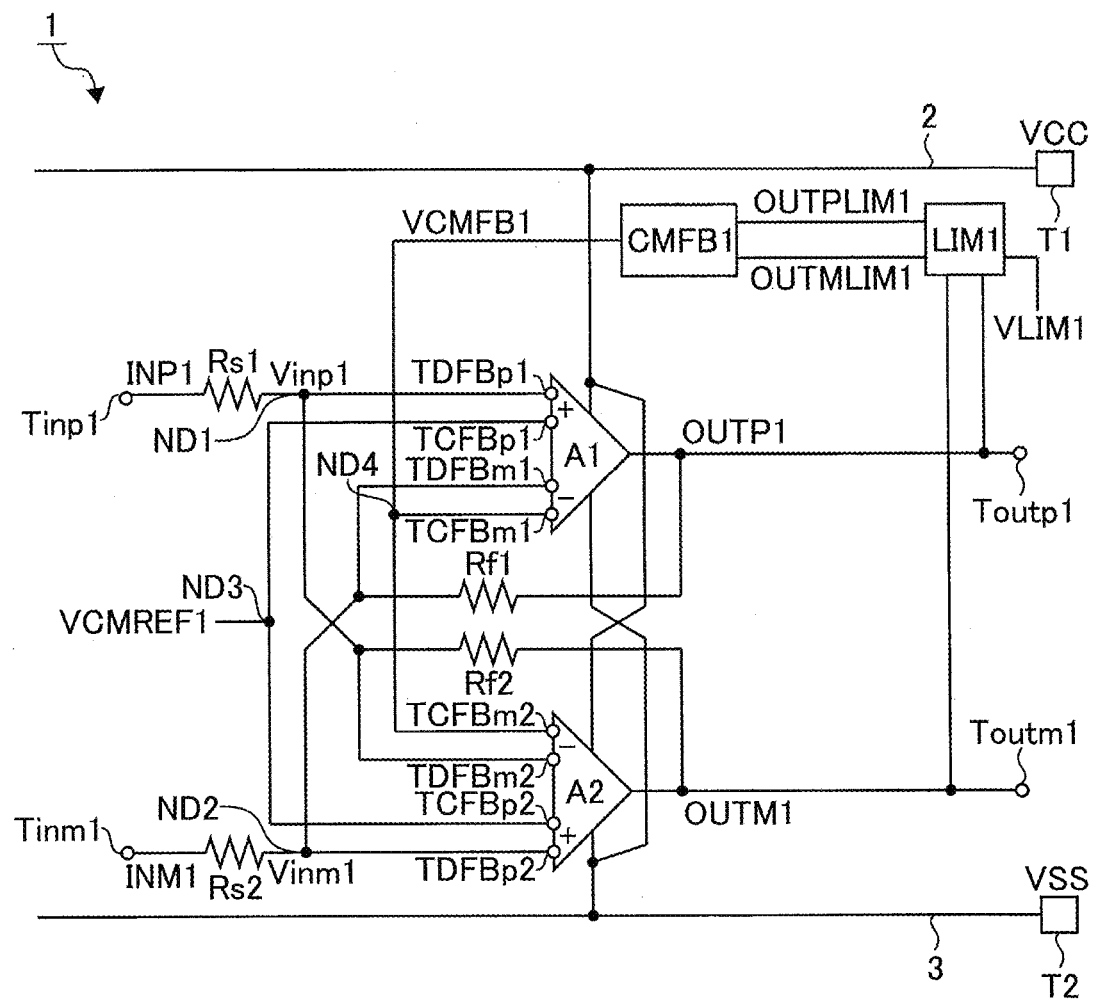
F I G. 1

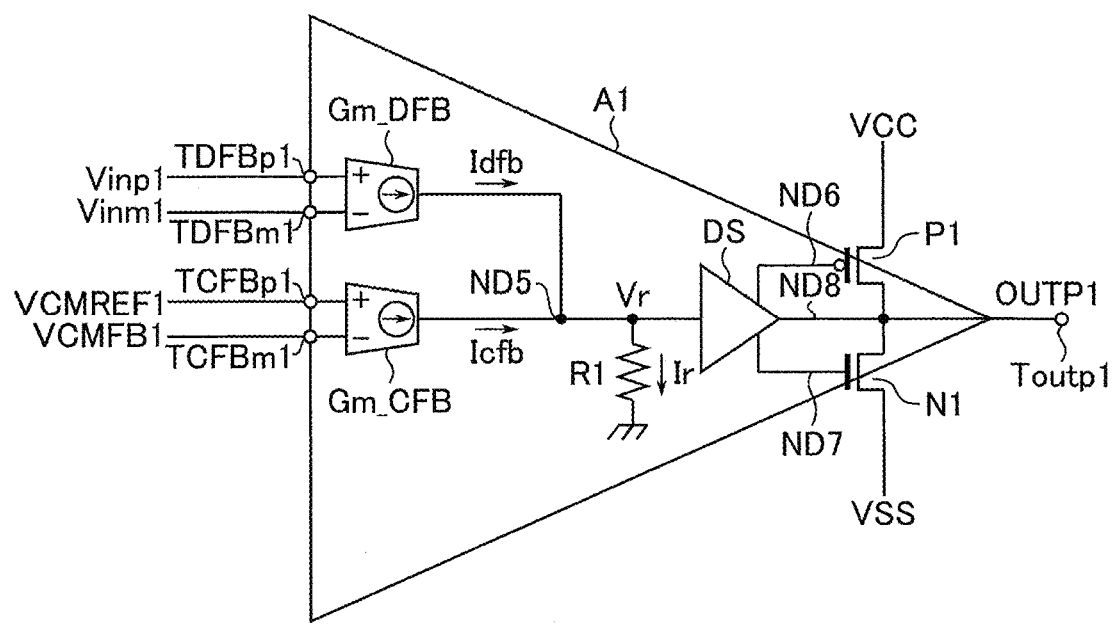
F I G. 2

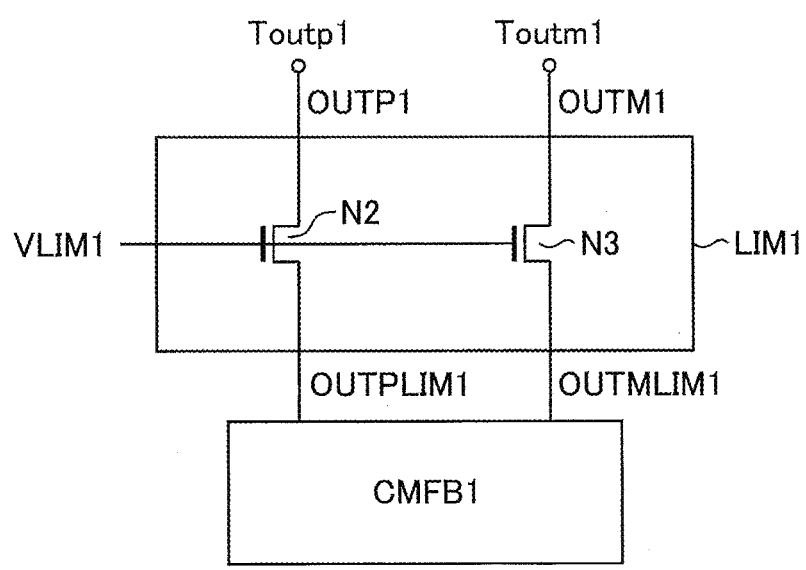
F I G. 3

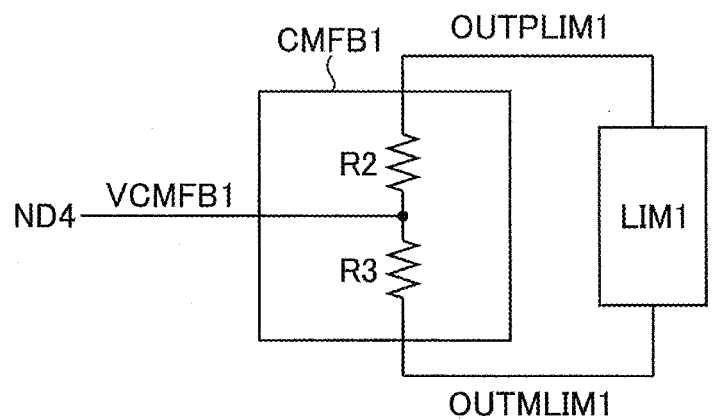
F I G. 4

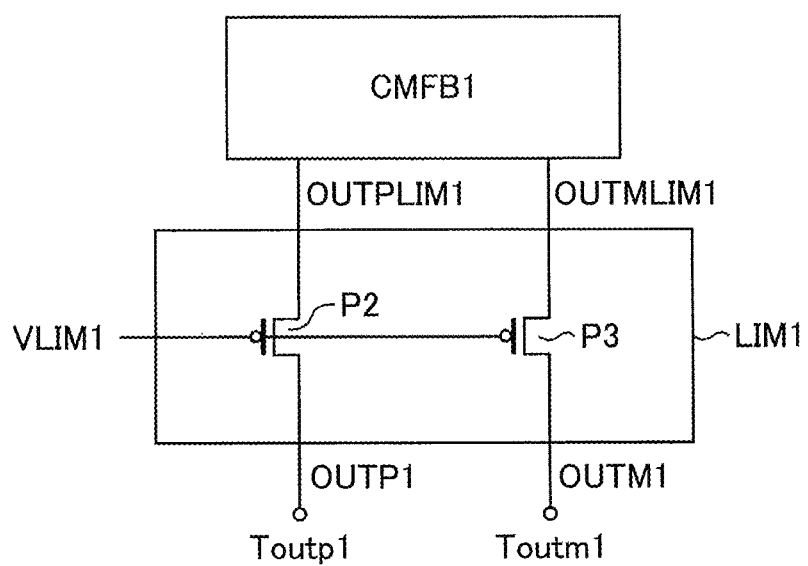
F I G. 8

US 12,267,052 B2

POWER AMPLIFYING DEVICE

CROSS-REFERENCE TO RELATED APPLICATIONS

This application is based upon and claims the benefit of priority from Japanese Patent Application No. 2021-154124, filed Sep. 22, 2021, the entire contents of which are incorporated herein by reference.

FIELD

Embodiments described herein relate generally to a power amplifying device.

BACKGROUND

As one type of power amplifying device, a BTL (Balanced Transformer Less, Bridge-Tied Load, or Bridged Transformer Less) amplifier is known.

BRIEF DESCRIPTION OF THE DRAWINGS

FIG. 1 is a circuit diagram showing an example of a power amplifying device according to a first embodiment.

FIG. 2 is a circuit diagram showing an example of an operational amplifier included in the power amplifying device according to the first embodiment.

FIG. 3 is a circuit diagram showing an example of a limiter circuit included in the power amplifying device according to the first embodiment.

FIG. 4 is a circuit diagram showing an example of an intermediate voltage generator included in the power amplifying device according to the first embodiment.

FIG. 8 is a circuit diagram showing an example of a limiter circuit included in a power amplifying device according to a second modification of the first embodiment.

DETAILED DESCRIPTION

Figure 5:
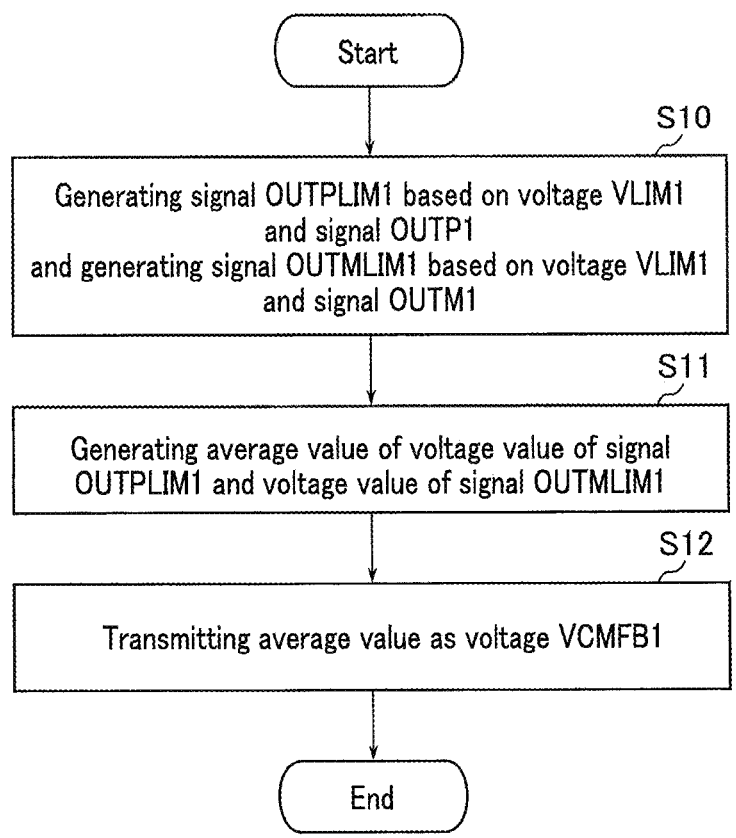
FIG. 5 is a flowchart showing an operation of the power amplifying device according to the first embodiment.

In general, according to one embodiment, a power amplifying device includes a first amplifier including a plurality of input terminals to which a plurality of voltages are applied, respectively, the first amplifier being configured to output a first output signal, a second amplifier including a plurality of input terminals to which a plurality of voltages are applied, respectively, the second amplifier being configured to output a second output signal, a first circuit configured to output a third signal obtained by limiting a magnitude of a voltage value of the first output signal and a fourth signal obtained by limiting a magnitude of a voltage value of the second output signal, and a second circuit configured to transmit an average value of a voltage value of the third signal and a voltage value of the fourth signal, as a first feedback voltage to the first amplifier and the second amplifier.

Hereinafter, embodiments will be described with reference to the accompanying drawings. In the following description, components having substantially the same function and configuration will be assigned the same reference numeral, and repeat descriptions may be omitted. The entire description about an embodiment is applicable to another embodiment unless it is expressly or implicitly excluded.

1. First Embodiment

A power amplifying device according to a first embodiment will be described. In the present embodiment, a BTL amplifier will be described as an example of the power amplifying device.

1.1. Configuration 1.1.1 Circuit Configuration of Power Amplifying Device

A circuit configuration of the power amplifying device according to the present embodiment will be described with reference to FIG. 1. FIG. 1 is a circuit diagram showing an example of the power amplifying device.

A power amplifying device 1 includes a power supply voltage interconnect 2, a ground voltage interconnect 3, a power supply voltage terminal T1, a ground voltage terminal T2, input terminals Tinp1 and Tinm1, output terminals Toutp1 and Toutm1, resistance elements Rs1 and Rs2, a first operational amplifier A1, a second operational amplifier A2, resistance elements Rf1 and Rf2, a limiter circuit LIM1, and an intermediate voltage generator CMFB1.

The power supply voltage interconnect 2 is coupled to the power supply voltage terminal T1, and a power supply voltage VCC is externally applied thereto.

The ground voltage interconnect 3 is coupled to the ground voltage terminal T2, and a ground voltage VSS is externally applied thereto.

A signal INP1 is externally input to the input terminal Tinp1.

A signal INM1 is externally input to the input terminal Tinm1. The signal INM1 is a signal obtained by inverting a phase of a signal INP1.

The resistance element Rs1 has one end coupled to the input terminal Tinp1, and the other end coupled to a node ND1.

The resistance element Rs2 has one end coupled to the input terminal Tinm1, and the other end coupled to a node ND2.

The first operational amplifier A1 has a first power supply voltage terminal coupled to the power supply voltage interconnect 2, and a second power supply voltage terminal coupled to the ground voltage interconnect 3. The first operational amplifier A1 includes a first non-inversion input terminal (hereinafter also referred to as a "TDFBp1 terminal"), a second non-inversion input terminal (hereinafter also referred to as a "TCFBp1 terminal"), a first inversion input terminal (hereinafter also referred to as a "TDFBm1 terminal"), and a second inversion input terminal (hereinafter also referred to as a "TCFBm1 terminal"). The first operational amplifier A1 has the TDFBp1 terminal coupled to the node ND1, the TCFBp1 terminal coupled to a node ND3, the TDFBm1 terminal coupled to the node ND2, and the TCFBm1 terminal coupled to a node ND4. A reference voltage VCMREF1 is applied to the node ND3. The reference voltage VCMREF1 is, for example, a voltage VCC/2; however, it is not limited thereto. An output terminal of the first operational amplifier A1 is coupled to the output terminal Toutp1.

The first operational amplifier A1 amplifies a voltage based on a voltage Vinp1 of the node ND1 which is applied to the TDFBp1 terminal, a voltage Vinm1 of the node ND2 which is applied to the TDFBm1 terminal, a voltage (reference voltage VCMREF1) of the node ND3 which is applied to the TCFBp1 terminal, and a voltage (feedback voltage VCMFB1 to be described later) of the node ND4 which is applied to the TCFBm1 terminal. The first operational amplifier A1 then outputs the amplified voltage as a signal OUTP1. The signal OUTP1 is output from the output terminal Toutp1. A configuration of the first operational amplifier A1 will be described later in detail.

The second operational amplifier A2 has a first power supply voltage terminal coupled to the power supply voltage interconnect 2, and a second power supply voltage terminal coupled to the ground voltage interconnect 3. The second operational amplifier A2 includes a first non-inversion input terminal (hereinafter also referred to as a "TDFBp2 terminal"), a second non-inversion input terminal (hereinafter also referred to as a "TCFBp2 terminal"), a first inversion input terminal (hereinafter also referred to as a "TDFBm2 terminal"), and a second inversion input terminal (hereinafter also referred to as a "TCFBm2 terminal"). The second operational amplifier A2 has the first non-inversion input terminal coupled to the node ND2, the second non-inversion input terminal coupled to the node ND3, the first inversion input terminal coupled to the node ND1, and the second inversion input terminal coupled to the node ND4. An output terminal of the second operational amplifier A2 is coupled to the output terminal Toutm1.

The second operational amplifier A2 amplifies a voltage based on the voltage Vinm1 of the node ND2 which is applied to the TDFBp2 terminal, the voltage Vinp1 of the node ND1 which is applied to the TDFBm2 terminal, the voltage (reference voltage VCMREF1) of the node ND3 which is applied to the TCFBp2 terminal, and the voltage (feedback voltage VCMFB1 to be described later) of the node ND4 which is applied to the TCFBm2 terminal. The second operational amplifier A2 then outputs the amplified voltage as a signal OUTM1. The signal OUTM1 is output from the output terminal Toutm1. A configuration of the second operational amplifier A2 will be described later in detail.

The resistance element Rf1 has one end coupled to the output terminal Toutp1 and the other end coupled to the node ND2. The signal OUTP1 is fed back to the TDFBm1 terminal of the first operational amplifier A1 with the resistance element Rf1 intervening therebetween.

The resistance element Rf2 has one end coupled to the output terminal Toutm1 and the other end coupled to the node ND1. The signal OUTM1 is fed back to the TDFBm2 terminal of the second operational amplifier A2 with the resistance element Rf2 intervening therebetween.

Hereinafter, a feedback operation through the resistance elements Rf1 and Rf2 will be referred to as a "first feedback operation".

The voltage VLIM1 is applied to the limiter circuit LIM1. The limiter circuit LIM1 is coupled to the output terminals Toutp1 and Toutm1. The limiter circuit LIM1 receives the signal OUTP1 from the first operational amplifier A1, and receives the signal OUTM1 from the second operational amplifier A2. The limiter circuit LIM1 is coupled to the intermediate voltage generator CMFB1. The limiter circuit LIM1 transmits a signal OUTPLIM1 based on the signal OUTP1 and a signal OUTMLIM1 based on the signal OUTM1 to the intermediate voltage generator CMFB1. Furthermore, the limiter circuit LIM1 limits a magnitude of a voltage value of the signals OUTP1 and OUTM1 (the maximum voltage value or minimum voltage value of the signals OUTP1 and OUTM1) based on the voltage VLIM1. The voltage VLIM1 is a voltage for determining the maximum voltage value or minimum voltage value of the signals OUTP1 and OUTM1. A configuration of the limiter circuit LIM1 will be described later in detail.

For example, in the case of limiting the maximum voltage value of the signals OUTP1 and OUTM1, the limiter circuit LIM1 determines a maximum voltage value Vmax of the signals OUTP1 and OUTM1 based on the voltage VLIM1. In the case of the signals OUTP1 and OUTM1 being smaller than the maximum voltage value Vmax, the limiter circuit LIM1 transmits the signals OUTP1 and OUTM1 as the signals OUTPLIM1 and OUTMLIM1 to the intermediate voltage generator CMFB1. On the other hand, in the case of the signals OUTP1 and OUTM1 being greater than or equal to the maximum voltage value Vmax, the limiter circuit LIM1 transmits the maximum voltage value Vmax as the signals OUTPLIM1 and OUTMLIM1 to the intermediate voltage generator CMFB1.

In the case of limiting the minimum voltage value of the signals OUTP1 and OUTM1, the limiter circuit LIM1 determines a minimum voltage value Vmin of the signals OUTP1 and OUTM1 based on the voltage VLIM1. In the case of the signals OUTP1 and OUTM1 being greater than the minimum voltage value Vmin, the limiter circuit LIM1 transmits the signals OUTP1 and OUTM1 as the signals OUTPLIM1 and OUTMLIM1 to the intermediate voltage generator CMFB1. On the other hand, in the case of the signals OUTP1 and OUTM1 being smaller than or equal to the minimum voltage value Vmin, the limiter circuit LIM1 transmits the minimum voltage value Vmin as the signals OUTP1 and OUTM1 to the intermediate voltage generator CMFB1.

The intermediate voltage generator CMFB1 is coupled to the node ND4. The intermediate voltage generator CMFB1 generates an average value of the signals OUTPLIM1 and OUTMLIM1 received from the limiter circuit LIM1. The intermediate voltage generator CMFB1 transmits the generated average value as the feedback voltage VCMFB1 to the node ND4. In other words, the voltage VCMFB1 is fed back from the intermediate voltage generator CMFB1 to the TCFBm1 terminal of the first operational amplifier A1 and the TCFBm2 terminal of the second operational amplifier A2. A configuration of the intermediate voltage generator CMFB1 will be described later in detail.

Hereinafter, a feedback operation through the limiter circuit LIM1 and the intermediate voltage generator CMFB1 will be referred to as a "second feedback operation".

1.1.2 Configuration of First Operational Amplifier

A circuit configuration of the first operational amplifier A1 will be described with reference to FIG. 2. FIG. 2 is a circuit diagram showing an example of the first operational amplifier A1. The second operational amplifier A2 has a similar configuration to that of the first operational amplifier A1. Hereinafter, when a source and a drain of a transistor are not distinguished from each other, one of them will be referred to as "one end of a transistor or a first end of a transistor" and the other of them will be referred to as "the other end of the transistor or a second end of the transistor".

The first operational amplifier A1 includes a first transconductance circuit Gm_DFB, a second transconductance circuit Gm_CFB, a resistance element R1, a driver stage circuit DS, a p-channel Metal Oxide Semiconductor Field Effect Transistor (MOSFET) (hereinafter, also referred to as a "PMOS transistor") P1, and an n-channel MOSFET (hereinafter, also referred to as an "NMOS transistor") N1.

The first transconductance circuit Gm_DFB has a non-inversion input terminal coupled to the TDFBp1 terminal of the first operational amplifier A1, and an inversion input terminal coupled to the TDFBm1 terminal of the first operational amplifier A1. An output terminal of the first transconductance circuit Gm_DFB is coupled to a node ND5. The first transconductance circuit Gm_DFB outputs a current Idfb based on a voltage difference between the voltage Vinp1 applied from the node ND1 to the non-inversion input terminal and the voltage Vinm1 applied from the node ND2 to the inversion input terminal. A transconductance gm of the first transconductance circuit Gm_DFB is set to a given value. In the case of no voltage difference between the voltage Vinp1 and the voltage Vinm1, the current Idfb is equal to 0.

The second transconductance circuit Gm_CFB has a non-inversion input terminal coupled to the TCFBp1 terminal of the first operational amplifier A1, and an inversion input terminal coupled to the TCFBm1 terminal of the first operational amplifier A1. An output terminal of the second transconductance circuit Gm_CFB is coupled to the node ND5. The second transconductance circuit Gm_CFB outputs a current Icfb based on a voltage difference between the reference voltage VCMREF1 applied from the node ND3 to the non-inversion input terminal and the feedback voltage VCMFB1 applied from the node ND4 to the inversion input terminal. A transconductance gm of the second transconductance circuit Gm_CFB is set to a given value. In the case of no voltage difference between the reference voltage VCMREF1 and the feedback voltage VCMFB1, the current Icfb is equal to 0.

One end of the resistance element R1 is connected to the node ND5, and the other end is grounded. A current Ir obtained by combining the current Idfb and the current Icfb flows through the resistance element R1. The current Ir is converted into a voltage Vr.

The voltage VCC is applied to a first power supply voltage terminal (not shown) of the driver stage circuit DS, and the voltage VSS is applied to a second power supply voltage terminal (not shown) of the driver stage circuit DS. The driver stage circuit DS has an input terminal coupled to the node ND5, and an output terminal coupled to nodes ND6 and ND7. The voltage Vr is applied to the driver stage circuit DS. The driver stage circuit DS amplifies the voltage Vr and outputs the amplified voltage, thereby driving the PMOS transistor P1 and the NMOS transistor N1, which take a push-pull configuration.

The PMOS transistor P1 has one end to which the voltage VCC is applied, the other end coupled to a node ND8, and a gate coupled to the node ND6. The PMOS transistor P1 is turned on when a voltage difference between a voltage of the node ND6 and the voltage VCC exceeds a threshold voltage of the PMOS transistor P1, and outputs a current in accordance with the voltage difference between the voltage of the node ND6 and the voltage VCC to the node ND8.

The NMOS transistor N1 has one end coupled to the node ND8, the other end to which the voltage VSS is applied, and a gate coupled to the node ND7. The NMOS transistor N1 is turned on when a voltage difference between a voltage of the node ND7 and the ground voltage VSS exceeds a threshold voltage of the NMOS transistor N1, and outputs a current in accordance with the voltage difference between the voltage of the node ND7 and the voltage VSS to the node ND8.

When a current is output from the PMOS transistor P1 or the NMOS transistor N1, a voltage of the node ND8 is controlled in accordance with a value of the current output from the PMOS transistor P1 or the NMOS transistor N1. That is, the signal OUTP1 is determined.

For example, in the case of the voltage Vr being positive, a current of the PMOS transistor P1 increases. At this time, the first operational amplifier A1 outputs, as the signal OUTP1, a voltage obtained by amplifying the voltage Vr to the positive side.

On the other hand, in the case of the voltage Vr being negative, a current of the NMOS transistor N1 increases. At this time, the first operational amplifier A1 outputs, as the signal OUTP1, a voltage obtained by amplifying the voltage Vr to the negative side.

1.1.3 Configuration of Limiter Circuit

A circuit configuration of the limiter circuit LIM1 will be described with reference to FIG. 3. FIG. 3 is a circuit diagram showing a limiter circuit for a low-side amplifier, as an example of the limiter circuit LIM1.

The limiter circuit LIM1 includes NMOS transistors N2 and N3.

The NMOS transistor N2 has one end coupled to the output terminal Toutp1, the other end coupled to the intermediate voltage generator CMFB1, and a gate to which the voltage VLIM1 applied. The voltage VLIM1 is greater than, for example, the reference voltage VCMREF1, and is a voltage that turns on the NMOS transistor N2. A maximum voltage value Vmaxp of the signal OUTP1 is determined based on the voltage VLIM1. In the case of the signal OUTP1 being smaller than the maximum voltage value Vmaxp, a voltage value of the signal OUTPLIM1 is equal to a voltage value of the signal OUTP1. In other words, the limiter circuit LIM1 transmits the signal OUTP1 as the signal OUTPLIM1 to the intermediate voltage generator CMFB1. On the other hand, in the case of the signal OUTP1 being greater than or equal to the maximum voltage value Vmaxp, a voltage value of the signal OUTPLIM1 is equal to the maximum voltage value Vmaxp. In other words, the limiter circuit LIM1 transmits the maximum voltage value Vmaxp as the signal OUTPLIM1 to the intermediate voltage generator CMFB1.

The NMOS transistor N3 has one end coupled to the output terminal Toutp1, the other end coupled to the intermediate voltage generator CMFB1, and a gate to which the voltage VLIM1 is applied. The voltage VLIM1 is greater than, for example, the reference voltage VCMREF1 and is a voltage that turns on the NMOS transistor N3. The maximum voltage value Vmaxm of the signal OUTM1 is determined based on the voltage VLIM1. In the case of the signal OUTM1 being smaller than the maximum voltage value Vmaxm, a voltage value of the signal OUTMLIM1 is equal to a voltage value of the signal OUTM1. In other words, the limiter circuit LIM1 transmits the signal OUTM1 as the signal OUTMLIM1 to the intermediate voltage generator CMFB1. On the other hand, in the case of the signal OUTM1 being greater than or equal to the maximum voltage value Vmaxm, a voltage value of the signal OUTMLIM1 is equal to the maximum voltage value Vmaxm. In other words, the limiter circuit LIM1 transmits the maximum voltage value Vmaxm as the signal OUTMLIM1 to the intermediate voltage generator CMFB1.

1.1.4 Configuration of Intermediate Voltage Generator

A circuit configuration of the intermediate voltage generator CMFB1 will be described with reference to FIG. 4. FIG. 4 is a circuit diagram showing an example of the intermediate voltage generator CMFB1.

The intermediate voltage generator CMFB1 includes resistance elements R2 and R3. The resistance elements R2 and R3 are equal in terms of resistance value.

The resistance element R2 has one end coupled to the limiter circuit LIM1, and the other end coupled to the node ND4.

The resistance element R3 has one end coupled to the node ND4, and the other end coupled to the limiter circuit LIM1.

Since the resistance elements R2 and R3 are equal in terms of resistance value, the intermediate voltage generator CMFB1 transmits an average value of a voltage value of the signal OUTPLIM1 and a voltage value of the signal OUTMLIM1 as the feedback voltage VCMFB1 to the node ND4.

1.2 Feedback Operation

A feedback operation of the power amplifying device 1 according to the present embodiment will be described with reference to FIG. 5. FIG. 5 is a flowchart showing the feedback operation of the power amplifying device 1. Of the first feedback operation and the second feedback operation, the second feedback operation will be described hereinafter.

The limiter circuit LIM1 generates the signal OUTPLIM1 based on the voltage VLIM1 and the signal OUTP1, and generates the signal OUTMLIM1 based on the voltage VLIM1 and the signal OUTM1 (S10).

Next, the intermediate voltage generator CMFB1 generates an average value of a voltage value of the signal OUTPLIM1 and a voltage value of the signal OUTMLIM1 (S11).

Next, the intermediate voltage generator CMFB1 transmits the average value generated in S11 as the feedback voltage VCMFB1 to the TCFBm1 terminal of the first operational amplifier A1 and the TCFBm2 terminal of the second operational amplifier A2 (S12).

1.3 Advantageous Effect

Figure 6:
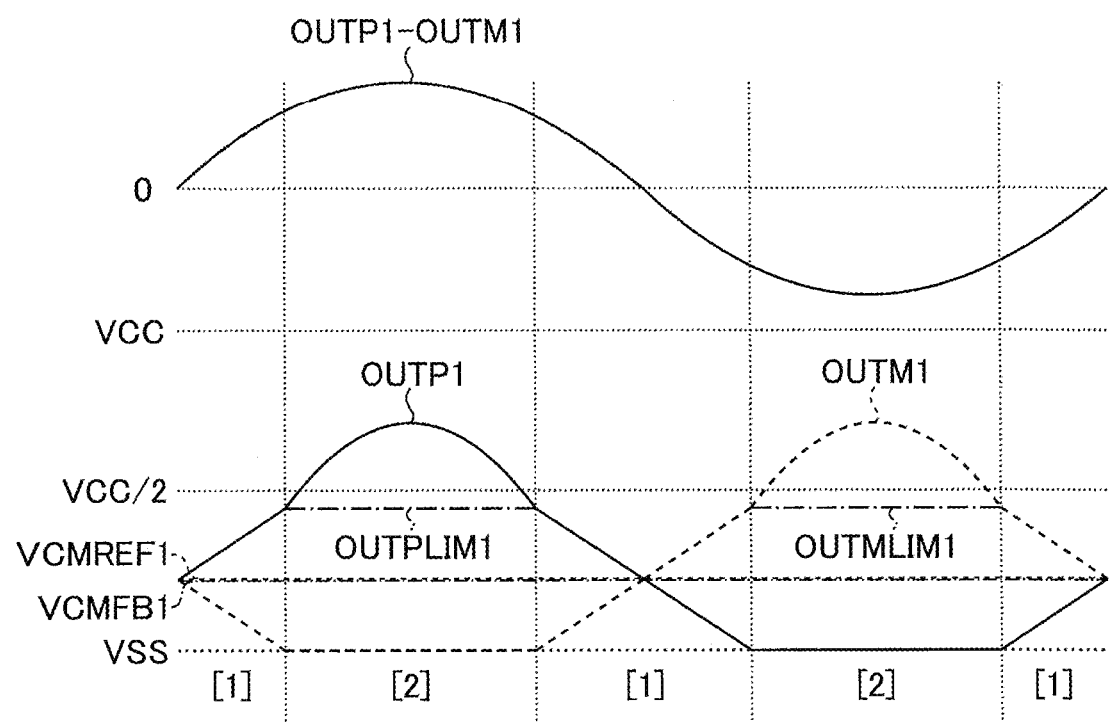
FIG. 6 is a diagram illustrating the advantageous effects of the power amplifying device according to the first embodiment.

The configuration according to the present embodiment can improve operation reliability of the power amplifying device. Hereinafter, this advantageous effect will be described with reference to FIG. 6. FIG. 6 is a diagram illustrating the advantageous effects of the power amplifying device 1 according to the present embodiment.

FIG. 6 shows waveforms of the signal OUTP1, the signal OUTM1, and a signal corresponding to a difference (OUTP1−OUTM1) between the signal OUTP1 and the signal OUTM1. In the example shown in FIG. 6, the reference voltage VCMREF1 is set to be smaller than the voltage VCC/2 and greater than the voltage VSS.

In the case of the signals OUTP1 and OUTM1 being small in amplitude (in regions [1]), the signals OUTP1 and OUTM1 are not clipped (non-clip). At the time of a non-clip, the amplitude of the signals OUTP1 and OUTM1 is vertically symmetric, and the feedback voltage VCMFB1 is maintained to a fixed value equal to the reference voltage VCMREF1.

On the other hand, in the case of the signals OUTP1 and OUTM1 being large in amplitude (in regions [2]), the signals OUTP1 and OUTM1 are clipped on the voltage VSS side. At this time, the unclipped signal OUTP1 or OUTM1 increases in amplitude because of the first feedback operation, so that the signals OUTP1 and OUTM1 become no longer vertically symmetric.

In the present embodiment, the following operation is performed as the second feedback operation. The limiter circuit LIM1 limits the maximum voltage value Vmax of the signals OUTP1 and OUTM1 based on the voltage VLIM1. Therefore, a voltage value of the signals OUTPLIM1 and OUTMLIM1 becomes smaller than or equal to the maximum voltage value Vmax determined based on the voltage VLIM1. The limiter circuit LIM1 transmits the signals OUTPLIM1 and OUTMLIM1 to the intermediate voltage generator CMFB1. The intermediate voltage generator CMFB1 generates an average value of a voltage value of the signal OUTPLIM1 and a voltage value of the signal OUTMLIM1, and transmits the average value as the feedback voltage VCMFB1 to the first operational amplifier A1 and the second operational amplifier A2. A voltage value of the signals OUTPLIM1 and OUTMLIM1 is limited to the maximum voltage value Vmax or smaller. Thus, in the case of the signals OUTP1 and OUTM1 being large in amplitude, the feedback voltage VCMFB1 is maintained to a fixed value equal to the reference voltage VCMREF1. That is, the configuration according to the present embodiment reduces variations in midpoint potential of the signals OUTP1 and OUTM1.

Furthermore, at the time of a non-clip and the time of a clip, a gain of the first operational amplifier A1 takes on a fixed value Rf1/Rs1, and a gain of the second operational amplifier A2 takes on a fixed value Rf2/Rs2. This can suppress deterioration in distortion of the signals OUTP1 and OUTM1 and OUTP1−OUTM1.

Accordingly, the present embodiment can improve operation reliability of the power amplifying device.

1.4 First Modification

The power amplifying device 1 according to a first modification of the first embodiment will be described. The power amplifying device 1 according to the present modification differs from the first embodiment in terms of the configuration of the first operational amplifier A1 and the second operational amplifier A2. Hereinafter, the following description will in principle concentrate on the features different from the first embodiment.

1.4.1 Configuration of First Operational Amplifier

Figure 7:
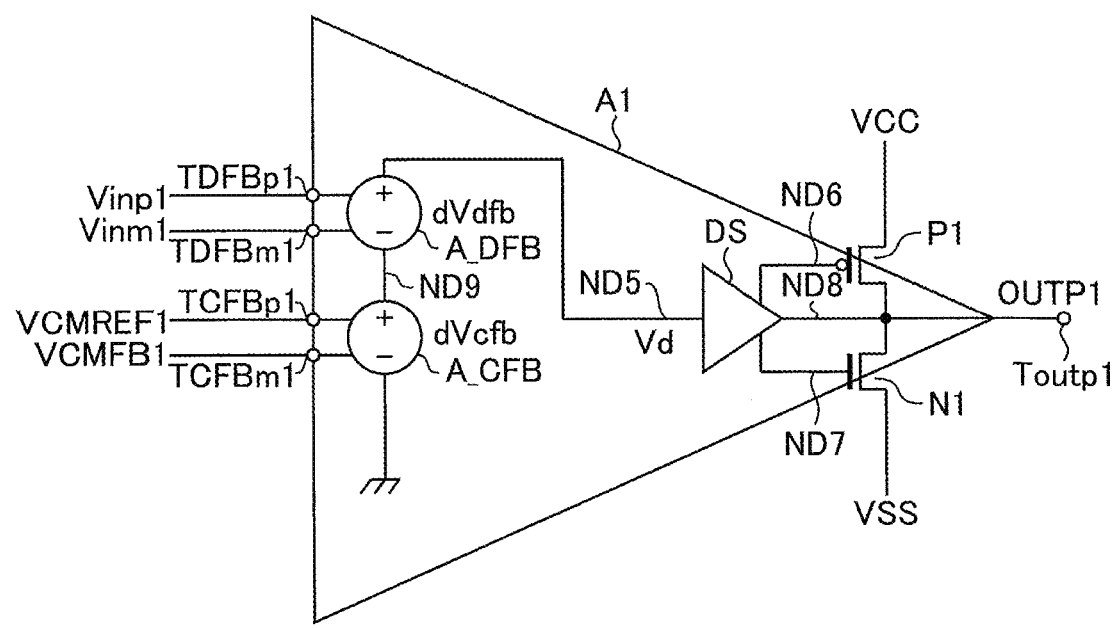
FIG. 7 is a circuit diagram showing an example of an operational amplifier included in a power amplifying device according to a first modification of the first embodiment.

A circuit configuration of the first operational amplifier A1 will be described with reference to FIG. 7. FIG. 7 is a circuit diagram showing an example of the first operational amplifier A1. The second operational amplifier A2 has a similar configuration to that of the first operational amplifier A1.

The first transconductance circuit Gm_DFB, the second transconductance circuit Gm_CFB, and the resistance element R1 are eliminated from the first operational amplifier A1. The first operational amplifier A1 further includes a first voltage control voltage source A_DFB and a second voltage control voltage source A_CFB.

The first voltage control voltage source A_DFB has a first power supply voltage terminal coupled to the node ND5, and a second power supply voltage terminal coupled to a node ND9. The first voltage control voltage source A_DFB has a non-inversion input terminal coupled to the TDFBp1 terminal of the first operational amplifier A1, and an inversion input terminal coupled to the TDFBm1 terminal of the first operational amplifier A1. The first voltage control voltage source A_DFB outputs a voltage difference dVdfb between the voltage Vinp1 applied from the node ND1 to the non-inversion input terminal and the voltage Vinm1 applied from the node ND2 to the inversion input terminal. The amplification factor of the first voltage control voltage source A_DFB is set to a given value.

The second voltage control voltage source A_CFB has a first power supply voltage terminal coupled to the node ND9, and the second power supply voltage terminal which is ground. The second voltage control voltage source A_CFB outputs a voltage difference dVcfb between the reference voltage VCMREF1 applied from the node ND3 to the non-inversion input terminal and the feedback voltage VCMFB1 applied from the node ND4 to the inversion input terminal. The amplification factor of the second voltage control voltage source A_CFB is set to a given value.

The rest of the configuration of the first operational amplifier A1 is similar to that of FIG. 2 according to the first embodiment.

A voltage Vd obtained by combining the voltage difference dVdfb and the voltage difference dVcfb is applied to the driver stage circuit DS. The driver stage circuit DS amplifies the voltage Vd and outputs the amplified voltage, thereby driving the PMOS transistor P1 and the NMOS transistor N1, which take a push-pull configuration.

1.4.2 Advantageous Effect

The configuration according to the present modification produces the advantageous effects similar to those of the first embodiment.

1.5 Second Modification

The power amplifying device 1 according to a second modification of the first embodiment will be described. The power amplifying device 1 according to the present modification differs from the first embodiment in terms of the configuration of the limiter circuit LIM1. Hereinafter, the following description will in principle concentrate on the features different from the first embodiment.

1.5.1 Configuration of Limiter Circuit

A circuit configuration of the limiter circuit LIM1 will be described with reference to FIG. 8. FIG. 8 is a circuit diagram showing a limiter circuit for a high-side amplifier, as an example of the limiter circuit LIM1.

The limiter circuit LIM1 includes PMOS transistors P2 and P3.

The PMOS transistor P2 has one end coupled to the output terminal Toutp1, the other end coupled to the intermediate voltage generator CMFB1, and a gate to which the voltage VLIM1 is applied. The voltage VLIM1 is smaller than, for example, the reference voltage VCMREF1 and is a voltage that turns on the PMOS transistor P2. The minimum voltage value Vminp of the signal OUTP1 is determined based on the voltage VLIM1. In the case of the signal OUTP1 being greater than the minimum voltage value Vminp, a voltage value of the signal OUTPLIM1 is equal to a voltage value of the signal OUTP1. In other words, the limiter circuit LIM1 transmits the signal OUTP1 as the signal OUTPLIM1 to the intermediate voltage generator CMFB1. On the other hand, in the case of the signal OUTP1 being smaller than or equal to the minimum voltage value Vminp, a voltage value of the signal OUTPLIM1 is equal to the minimum voltage value Vminp. In other words, the limiter circuit LIM1 transmits the minimum voltage value Vminp as the signal OUTPLIM1 to the intermediate voltage generator CMFB1.

The PMOS transistor P3 has one end coupled to the output terminal Toutm1, the other end coupled to the intermediate voltage generator CMFB1, and a gate to which the voltage VLIM1 is applied. The voltage VLIM1 is smaller than, for example, the reference voltage VCMREF1 and is a voltage that turns on the PMOS transistor P3. A minimum voltage value Vminm of the signal OUTM1 is determined based on the voltage VLIM1. In the case of the signal OUTM1 being greater than the minimum voltage value Vminm, a voltage value of the signal OUTMLIM1 is equal to a voltage value of the signal OUTM1. In other words, the limiter circuit LIM1 transmits the signal OUTM1 as the signal OUTMLIM1 to the intermediate voltage generator CMFB1. On the other hand, in the case of the signal OUTM1 being smaller than or equal to the minimum voltage value Vminm, a voltage value of the signal OUTMLIM1 is equal to the minimum voltage value Vminm. In other words, the limiter circuit LIM1 transmits the minimum voltage value Vminm as the signal OUTMLIM1 to the intermediate voltage generator CMFB1.

1.5.2 Feedback Operation

A feedback operation of the power amplifying device 1 according to the present modification will be described. A flowchart showing a second feedback operation of the power amplifying device 1 according to the present modification is similar to that of FIG. 5 according to the first embodiment.

1.5.3 Advantageous Effect

In the present modification, the limiter circuit LIM1 limits, as the second feedback operation, the minimum voltage value Vmin of the signals OUTP1 and OUTM1 based on the voltage VLIM1. Therefore, a voltage value of the signals OUTPLIM1 and OUTMLIM1 becomes greater than or equal to the minimum voltage value Vmin determined based on the voltage VLIM1. For example, in the case where the reference voltage VCMREF1 is set to be a voltage greater than the voltage VCC/2 and smaller than the voltage VCC, the signals OUTP1 and OUTM1 are clipped on the voltage VCC side when their amplitude increases. However, as with the first embodiment, because a voltage value of the signals OUTPLIM1 and OUTMLIM1 is limited to the minimum voltage value Vmin or greater, the configuration according to the present modification reduces variations in midpoint potential of the signals OUTP1 and OUTM1.

Furthermore, as with the first embodiment, the configuration according to the present modification can suppress deterioration in distortion of the signals OUTP1 and OUTM1, and OUTP1–OUTM1.

2. Second Embodiment

The power amplifying device 1 according to a second embodiment will be described. The power amplifying device 1 according to the present embodiment differs from the first embodiment in terms of containing a BTL amplifier (hereinafter also referred to as a "high-side amplifier HS") including a third operational amplifier A3 and a fourth operational amplifier A4. The first embodiment is directed to a 1ch (1 channel) power amplifying device, whereas the second embodiment is directed to a 2ch (2 channel) power amplifying device. As compared with a power amplifying device including two power amplifying devices according to the first embodiment, the second embodiment can operate with a higher degree of efficiency by sharing power consumed by the high-side amplifier HS with the low-side amplifier LS. Hereinafter, the following description will in principle concentrate on the feature different from the first embodiment.

2.1 Circuit Configuration of Power Amplifying Device

Figure 9:
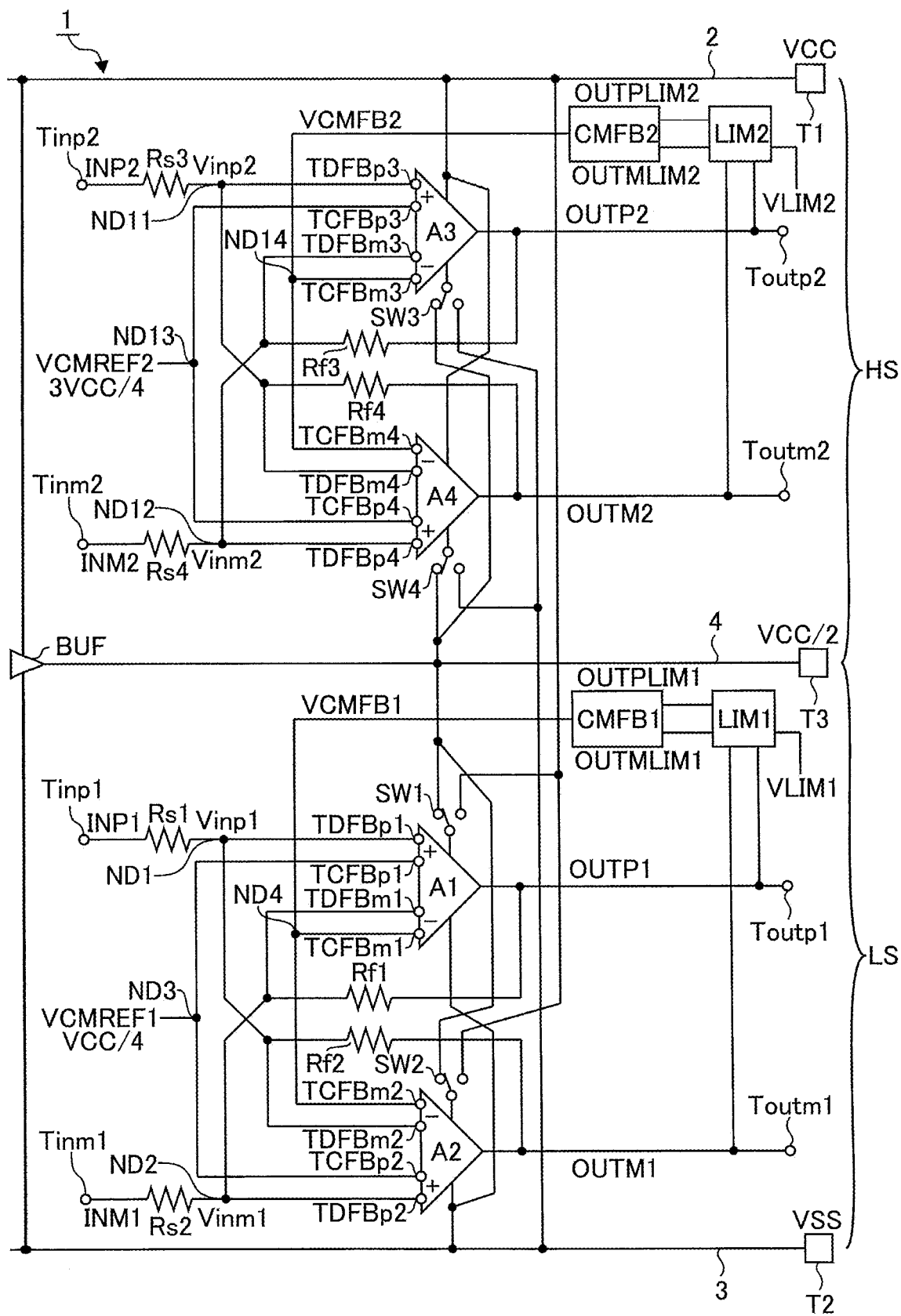
FIG. 9 is a circuit diagram showing an example of a power amplifying device according to a second embodiment.

A circuit configuration of the power amplifying device 1 according to the present embodiment will be described with reference to FIG. 9. FIG. 9 is a circuit diagram showing an example of the power amplifying device 1.

The power amplifying device 1 further includes a buffer circuit BUF, a first voltage interconnect 4, and a first voltage terminal T3.

The buffer circuit BUF generates a voltage VCC/2 as a divided voltage of a voltage between the power supply voltage interconnect 2 and the ground voltage interconnect 3.

The first voltage interconnect 4 is coupled to the first voltage terminal T3, and the voltage VCC/2 is supplied from the buffer BUF to the first voltage terminal T3.

The BTL amplifier (hereinafter also referred to as a "low-side amplifier LS") including the first operational amplifier A1 and the second operational amplifier A2 further includes the switches SW1 and SW2.

The switch SW1 is coupled to the first power supply voltage terminal of the first operational amplifier A1, and switches the coupling between the first power supply voltage terminal of the first operational amplifier A1 and the power supply voltage interconnect 2 and the coupling between the first power supply voltage terminal of the first operational amplifier A1 and the first voltage interconnect 4.

The switch SW2 is coupled to the first power supply voltage terminal of the second operational amplifier A2, and switches the coupling between the first power supply voltage terminal of the second operational amplifier A2 and the power supply voltage interconnect 2 and the coupling between the first power supply voltage terminal of the second operational amplifier A2 and the first voltage interconnect 4.

For example, in the case where the signals OUTP1 and OUTM1 are small in amplitude (for example, a voltage value of the signals OUTP1 and OUTM1 (a voltage value with respect to the voltage VCC) is smaller than the voltage VCC/2), the switches SW1 and SW2 are coupled to the first voltage interconnect 4. By this, the voltage VCC/2 and the voltage VSS are applied to the first operational amplifier A1 and the second operational amplifier A2.

On the other hand, in the case where the signals OUTP1 and OUTM1 are large in amplitude (for example, a voltage value of the signal OUTP1 or OUTM1 (a voltage value with respect to the voltage VCC) is greater than or equal to the voltage VCC/2), the switches SW1 and SW2 are coupled to the power supply voltage interconnect 2. By this, the voltage VCC and the voltage VSS are applied to the first operational amplifier A1 and the second operational amplifier A2.

In the low-side amplifier LS, the reference voltage VCM-REF1 is, for example, a voltage VCC/4.

The high-side amplifier HS includes input terminals Tinp2 and Tinm2, output terminals Toutp2 and Toutm2, resistance elements Rs3 and Rs4, a third operational amplifier A3, a fourth operational amplifier A4, resistance elements Rf3 and Rf4, switches SW3 and SW4, a limiter circuit LIM2, and an intermediate voltage generator CMFB2.

The input terminals Tinp2 and Tinm2 respectively correspond to the input terminals Tinp1 and Tinm1 of the low-side amplifier LS.

The output terminals Toutp2 and Toutm2 respectively correspond to the output terminals Toutp1 and Toutm1 of the low-side amplifier LS.

The resistance elements Rs3 and Rs4 respectively correspond to the resistance elements Rs1 and Rs2 of the low-side amplifier LS.

A TDFBp3 terminal, a TCFBp3 terminal, a TDFBm3 terminal, and a TCFBm3 terminal of the third operational amplifier A3 respectively correspond to the TDFBp1 terminal, the TCFBp1 terminal, the TDFBm1 terminal, and the TCFBm1 terminal of the first operational amplifier A1 of the low-side amplifier LS. The third operational amplifier A3 has a similar configuration to that of the first operational amplifier A1.

A TDFBp4 terminal, a TCFBp4 terminal, a TDFBm4 terminal, and a TCFBm4 terminal of the fourth operational amplifier A4 respectively correspond to the TDFBp2 terminal, the TCFBp2 terminal, the TDFBm2 terminal, and the TCFBm2 terminal of the second operational amplifier A2 of the low-side amplifier LS. The fourth operational amplifier A4 has a similar configuration to that of the second operational amplifier A2.

The resistance elements Rf3 and Rf4 respectively correspond to the resistance elements Rf1 and Rf2 of the low-side amplifier LS.

The switch SW3 is coupled to the second power supply voltage terminal of the third operational amplifier A3, and switches the coupling between the second power supply voltage terminal of the third operational amplifier A3 and the ground voltage interconnect 3 and the coupling between the second power supply voltage terminal of the third operational amplifier A3 and the first voltage interconnect 4. The switch SW3 corresponds to the switch SW1 of the low-side amplifier LS.

The switch SW4 is coupled to the second power supply voltage terminal of the fourth operational amplifier A4, and switches the coupling between the second power supply voltage terminal of the fourth operational amplifier A4 and the ground voltage interconnect 3 and the coupling between the second power supply voltage terminal of the fourth operational amplifier A4 and the first voltage interconnect 4. The switch SW4 corresponds to the switch SW2 of the low-side amplifier LS.

For example, in the case where the signals OUTP2 and OUTM2 are small in amplitude (for example, a voltage value of the signals OUTP2 and OUTM2 (a voltage value with respect to the voltage VSS) is greater than or equal to the voltage VCC/2), the switches SW3 and SW4 are coupled to the first voltage interconnect 4. By this, the voltage VCC and the voltage VCC/2 are applied to the third operational amplifier A3 and the fourth operational amplifier A4.

On the other hand, in the case where the signals OUTP2 and OUTM2 are large in amplitude (for example, a voltage value of the signal OUTP2 or OUTM2 (a voltage value with respect to the voltage VSS) is smaller than the voltage VCC/2), the switches SW3 and SW4 are coupled to the ground voltage interconnect 3. By this, the voltage VCC and the voltage VSS are applied to the third operational amplifier A3 and the fourth operational amplifier A4.

The limiter circuit LIM2 corresponds to the limiter circuit LIM1 of the low-side amplifier LS. The limiter circuit LIM2 has a configuration similar to that of the limiter circuit LIM1 according to the second modification of the first embodiment.

The intermediate voltage generator CMFB2 corresponds to the intermediate voltage generator CMFB1 of the low-side amplifier LS. The intermediate voltage generator CMFB2 has a configuration similar to that of the intermediate voltage generator CMFB1.

The signals INP2 and INM2 respectively correspond to the signals INP1 and INM1 of the low-side amplifier LS.

The nodes ND11 and ND12 respectively correspond to the nodes ND1 and ND2 of the low-side amplifier LS.

The voltages Vinp2 and Vinm2 respectively correspond to the voltages Vinp1 and Vinm1 of the low-side amplifier LS.

The reference voltage VCMREF2 and the feedback voltage VCMFB2 respectively correspond to the reference voltage VCMREF1 and the feedback voltage VCMFB1 of the low-side amplifier LS. The reference voltage VCMREF2 is, for example, a voltage 3VCC/4.

The nodes ND13 and ND14 respectively correspond to the nodes ND3 and ND4 of the low-side amplifier LS.

The signals OUTP2 and OUTM2 respectively correspond to the signals OUTP1 and OUTM1 of the low-side amplifier LS.

The voltage VLIM2 and the signals OUTPLIM2 and OUTMLIM2 respectively correspond to the voltage VLIM1 of the low-side amplifier LS and the signals OUTPLIM1 and OUTMLIM1.

2.2 Feedback Operation

A feedback operation of the power amplifying device 1 according to the present embodiment will be described. A flowchart showing a second feedback operation in the low-side amplifier LS and the high-side amplifier HS of the power amplifying device 1 according to the present embodiment is similar to that of FIG. 5 according to the first embodiment.

2.3 Advantageous Effect

The present embodiment has advantageous effects similar to those described in the first embodiment.

Furthermore, as with the first embodiment, the present embodiment reduces variations in midpoint potential of the signals OUTP1 and OUTM1 and variations in midpoint potential of the signals OUTP2 and OUTM2. This maximizes a range in which the power amplifying device 1 operates with a high degree of efficiency. In the power amplifying device including two or more power amplifying devices according to the second embodiment, even if output terminals of the low-side amplifiers LS are coupled to each other by mistake and output terminals of the high-amplifiers HS are coupled to each other by mistake, a potential difference between the output terminals coupled together by mistake is small because variations in midpoint potential are small. This decreases a value of a flowing short-circuit current. Accordingly, a circuit for protecting a short-circuit with another channel is not necessarily provided.

As a matter of course, the present embodiment is applicable to the first modification of the first embodiment.

3. Modifications Etc.

As described in the above, a power amplifying device (1) according to an embodiment includes a first amplifier (A1) including a plurality of input terminals to which a plurality of voltages are applied, respectively, the first amplifier (A1) being configured to output a first output signal (OUTP1), a second amplifier (A2) including a plurality of input terminals to which a plurality of voltages are applied, respectively, the second amplifier (A2) being configured to output a second output signal (OUTM1), a first circuit (LIM1) configured to output a third signal (OUTPLIM1) obtained by limiting a magnitude of a voltage value of the first output signal (OUTP1) and a fourth signal (OUTMLIM1) obtained by limiting a magnitude of a voltage value of the second output signal (OUTM1), and a second circuit (CMFB1) configured to transmit an average value of a voltage value of the third signal (OUTPLIM1) and a voltage value of the fourth signal (OUTMLIM1), as a first feedback voltage (VCMFB1) to the first amplifier (A1) and the second amplifier (A2).

The embodiments are not limited to those described in the above, and various modifications can be made.

The order of the steps in the above-described flowchart may be altered in any manner possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A power amplifying device comprising:
a first amplifier including a plurality of input terminals to which a plurality of voltages are applied, respectively, the first amplifier being configured to output a first output signal;
a second amplifier including a plurality of input terminals to which a plurality of voltages are applied, respectively, the second amplifier being configured to output a second output signal;
a first circuit configured to output a third signal obtained by limiting a magnitude of a voltage value of the first output signal, and a fourth signal obtained by limiting a magnitude of a voltage value of the second output signal; and
a second circuit configured to transmit an average value of a voltage value of the third signal and a voltage value of the fourth signal, as a first feedback voltage to the first amplifier and the second amplifier.

2. The device according to claim 1, wherein
the plurality of input terminals of the first amplifier includes:
a first non-inversion input terminal to which a first voltage corresponding to a first input signal is applied;
a first inversion input terminal to which a second voltage corresponding to a second input signal is applied;
a second non-inversion input terminal to which a first reference voltage is applied; and
a second inversion input terminal to which the first feedback voltage is applied, and
the plurality of input terminals of the second amplifier includes:
a third inversion input terminal to which the first voltage is applied;
a third non-inversion input terminal to which the second voltage is applied;
a fourth non-inversion input terminal to which the first reference voltage is applied; and
a fourth inversion input terminal to which the first feedback voltage is applied.

3. The device according to claim 2, wherein the first amplifier generates the first output signal based on a first current and a second current, the first current being based on the first voltage and the second voltage, the second current being based on the first reference voltage and the first feedback voltage.

4. The device according to claim 2, wherein the first amplifier generates the first output signal based on a voltage difference between the first voltage and the second voltage, and a voltage difference between the first reference voltage and the first feedback voltage.

5. The device according to claim 1, wherein the first circuit limits a maximum voltage value of the first output signal and the second output signal, or a minimum voltage value of the first output signal and the second output signal.

6. The device according to claim 1, wherein the first circuit is configured to:
in a case of the first output signal being smaller than a maximum voltage value, transmit the first output signal as the third signal to the second circuit; and
in a case of the first output signal being greater than or equal to the maximum voltage value, transmit the maximum voltage value as the third signal to the second circuit.

7. The device according to claim 1, wherein the first circuit is configured to:
in a case of the second output signal being smaller than a maximum voltage value, transmit the second output signal as the fourth signal to the second circuit; and
in a case of the second output signal being greater than or equal to the maximum voltage value, transmit the maximum voltage value as the fourth signal to the second circuit.

8. The device according to claim 1, wherein the first circuit is configured to:
in a case of the first output signal being greater than a minimum voltage value, transmit the first output signal as the third signal to the second circuit; and
in a case of the first output signal being smaller than or equal to the minimum voltage value, transmit the minimum voltage value as the third signal to the second circuit.

9. The device according to claim 1, wherein the first circuit is configured to:
in a case of the second output signal being greater than a minimum voltage value, transmit the second output signal as the fourth signal to the second circuit; and
in a case of the second output signal being smaller than or equal to the minimum voltage value, transmit the minimum voltage value as the fourth signal to the second circuit.

10. The device according to claim 1, wherein
the first circuit includes a first transistor and a second transistor,
the first transistor includes a first end, a second end, and a gate, the first output signal being input to the first end of the first transistor, the second end of the first transistor being coupled to the second circuit, and a third voltage being applied to the gate of the first transistor, and
the second transistor includes a first end, a second end, and a gate, the second output signal being input to the first end of the second transistor, the second end of the second transistor being coupled to the second circuit, and the third voltage being applied to the gate of the second transistor.

11. The device according to claim 1, wherein the second circuit includes a first resistance element and a second resistance element,
the first resistance element includes one end coupled to the first circuit, and the other end coupled to the first amplifier and the second amplifier, and
the second resistance element includes one end coupled to the first amplifier and the second amplifier, and the other end coupled to the first circuit.

12. The device according to claim 11, wherein a resistance value of the first resistance element is equal to a resistance value of the second resistance element.

13. The device according to claim 1, further comprising:
a third amplifier including a plurality of input terminals to which a plurality of voltages are applied, respectively, the third amplifier being configured to output a third output signal;
a fourth amplifier including a plurality of input terminals to which a plurality of voltages are applied, respectively, the fourth amplifier being configured to output a fourth output signal;
a third circuit configured to output a fifth signal obtained by limiting a magnitude of a voltage value of the third output signal, and a sixth signal obtained by limiting a magnitude of a voltage value of the fourth output signal; and
a fourth circuit configured to transmit an average value of a voltage value of the fifth signal and a voltage value of the sixth signal, as a second feedback voltage to the third amplifier and the fourth amplifier.

14. The device according to claim 13, wherein
the plurality of input terminals of the third amplifier includes:
a fifth non-inversion input terminal to which a fourth voltage corresponding to a third input signal is applied;
a fifth inversion input terminal to which a fifth voltage corresponding to a fourth input signal is applied;
a sixth non-inversion input terminal to which a second reference voltage is applied; and
a sixth inversion input terminal to which the second feedback voltage is applied, and
the plurality of input terminals of the fourth amplifier includes:
a seventh inversion input terminal to which the fourth voltage is applied;
a seventh non-inversion input terminal to which the fifth voltage is applied;
an eighth non-inversion input terminal to which the second reference voltage is applied; and
an eighth inversion input terminal to which the second feedback voltage is applied.

* * * * *